United States Patent
Deng et al.

(10) Patent No.: US 6,704,343 B2
(45) Date of Patent: Mar. 9, 2004

(54) HIGH POWER SINGLE MODE VERTICAL CAVITY SURFACE EMITTING LASER

(75) Inventors: Hongyu Deng, Arcadia, CA (US); Thomas Lenosky, Mountain View, CA (US); Giorgio Giaretta, Mountain View, CA (US); Jan Lipson, Cupertino, CA (US)

(73) Assignee: Finisar Corporation, Sunnyvale, CA (US)

( * ) Notice: Subject to any disclaimer, the term of this patent is extended or adjusted under 35 U.S.C. 154(b) by 0 days.

(21) Appl. No.: 10/198,229

(22) Filed: Jul. 18, 2002

(65) Prior Publication Data

US 2004/0013157 A1 Jan. 22, 2004

(51) Int. Cl.$^7$ ............................. H01S 3/082; H01S 5/00
(52) U.S. Cl. ............................................. 372/97; 372/46
(58) Field of Search ............................. 372/43, 45, 46, 372/50, 97, 109

(56) References Cited

U.S. PATENT DOCUMENTS

| | | | | |
|---|---|---|---|---|
| 5,617,445 A | * | 4/1997 | Jewell | 372/96 |
| 5,684,817 A | | 11/1997 | Houdre et al. | |
| 5,955,749 A | * | 9/1999 | Joannopoulos et al. | 257/98 |
| 6,366,392 B1 | * | 4/2002 | Tokushima | 359/321 |
| 6,416,575 B2 | * | 7/2002 | Yamada | 117/2 |
| 6,452,713 B1 | * | 9/2002 | White | 359/322 |
| 6,466,360 B2 | * | 10/2002 | Tokushima | 359/321 |
| 6,574,383 B1 | * | 6/2003 | Erchak et al. | 385/15 |

OTHER PUBLICATIONS

Unold et al., "Photonic Crystal Surface–Emitting Lasers: Tailoring Waveguiding for Single–Mode Emission", 27$^{th}$ European Conference on Optical Communication, Sep. 30–Oct. 4, 2001, vol. 4, pp. 520–521.*
Song et al., "Single–Mode Photonic Crystal Vertical Cavity Surface Emitting Laser", Lasers and Electro–Optics Conference, May 19–24, 2002, vol. 1, pp. 293–294.*
US 2002/0196827A1, Shields et al.*
2002/0163947 A1, Ostergaard et al.*
Dae–Sung Song, et al., *Single–Fundamental–Mode Photonic–crystal Vertical–cavity surface–emitting Lasers*, Applied Physics Letters, vol. 80, No. 21, May 27, 2002, pp. 3901–3903.

* cited by examiner

Primary Examiner—David Porta
Assistant Examiner—Davienne Monbleau
(74) Attorney, Agent, or Firm—Workman Nydegger (57) ABSTRACT

A single mode high power vertical cavity surface emitting laser (VCSEL) using photonic crystals. A photonic crystal is included in at least one mirror layer of a VCSEL. The reflectivity of the photonic crystal is dependent on the wavelength and incident angle of the photons. The photonic crystal can be formed such that the VCSEL lases at a single mode. Because a single mode is generated, the aperture of the VCSEL can be enlarged to increase the power that is generated by the VCSEL for that mode. The photonic crystal can be used with/without DBR layers. The photonic crystal, in one example, forms an external cavity.

24 Claims, 5 Drawing Sheets

FIG. 9

HIGH POWER SINGLE MODE VERTICAL CAVITY SURFACE EMITTING LASER

BACKGROUND OF THE INVENTION

1. The Field of the Invention

The present invention relates to vertical cavity surface emitting lasers. More particularly, the present invention relates to vertical cavity surface emitting lasers that generate high power in a single mode using photonic crystals.

2. Background and Relevant Art

One of the light sources used in optical communication systems is a vertical cavity surface emitting laser (VCSEL). VCSELs are popular in part because they can be manufactured in large quantities due to their relatively small size and can be tested in wafer form. VCSELs typically have low threshold currents and can be modulated at high speeds. VCSELs also couple well to optical fibers.

In a VCSEL, the light or optical signal being amplified resonates in a direction that is perpendicular to the pn-junction. The cavity or active region of a VCSEL is thus relatively short and a photon has a small chance of stimulating the emission of an additional photon with a single pass through the active region. To increase the likelihood of stimulating the emission of photons, VCSELs require highly efficient mirror systems such that a photon can make multiple passes through the active region. The reflectivity requirement of VCSELs cannot easily be achieved with metallic mirrors.

VCSELs thus employ Distributed Bragg Reflector (DBR) layers as mirrors. The semiconductor materials or dielectric materials used in DBR layers are grown or formed such that each layer has a refractive index that is different from the refractive index of adjoining layers. The junctions between the DBR layers that are grown in this fashion cause light to be reflected. The amount of light reflected, however, by a single junction is relatively small and is often dependent on the variance between the relative refractive indices of the adjoining materials. For this reason, a relatively large number of DBR layers are formed in a VCSEL in order to achieve high reflectivity. VCSELs, for example, often have on the order of 50 to 100 DBR layers in order to achieve sufficient reflectivity.

Even though forming a large number of DBR layers can be a difficult task, VCSELs are attractive for various low power and/or multi-transverse mode applications because they are easy to test, have a good beam profile and typically have low power consumption. These attributes also make VCSELs unattractive for other applications, such as those that require more power in a single mode. For example, high power pump lasers are required for erbium doped fiber amplifiers. The power supplied by the pump lasers should be delivered in a single mode in order to avoid excessive noise. Current VCSELs are not suitable for this application because single mode VCSELs do not produce sufficient power. Those VCSELs that do produce sufficient power introduce excessive noise because more than one mode is generated. As a result, higher cost edge emitting lasers are often used for these applications.

A single mode high power VCSEL is difficult to produce for various reasons. The wavelengths reflected by the DBR mirrors depend on the composition and thickness of the DBR layers. The resonance wavelengths of the cavity depend on the composition and thickness of the cavity and of the DBR layers. Growing VCSEL wafers is difficult because the thickness, composition, and doping requirements must all be monitored at the same time for, potentially, hundreds of layers. Even when the growth and fabrication issues are overcome, high power VCSELs generate light output with high order transverse modes. A single mode high power VCSEL would overcome these and other problems.

BRIEF SUMMARY OF THE INVENTION

These and other limitations are overcome by the present invention which relates to single mode high power vertical cavity surface emitting lasers. Vertical cavity surface emitting lasers include mirror layers or regions that reflect photons through an active region repeatedly. This is necessary in order to stimulate the emission of additional photons, which ultimately results in the laser output. Distributed Bragg Reflector (DBR) layers are used as the mirrors in most VCSELs and the present invention is a VCSEL where at least one of the mirror layers of a VCSEL is formed from a photonic crystal or from a combination of photonic crystals and DBR layers.

A photonic crystal or layer is produced by creating cavities or apertures in a material such as a semiconductor material or a dielectric material. The cavities in the photonic crystal form a periodic cavity structure. In one embodiment, the periodicity of the cavity structure is on the order of the light wavelengths in the material (typically a few hundred nanometers). The periodic nature of the cavity structure is similar to the atomic lattice structure of various materials, but on a larger scale. The periodic cavity structure of a photonic crystal is not confined to or limited by the atomic lattice structure of the material and can be formed as required using various configurations and shapes. Because the photonic crystals used in the present invention are usually planar in nature, the periodic cavity structure is usually two dimensional, although a three dimensional cavity structure is contemplated by the present invention.

When a VCSEL is fabricated in accordance with the present invention, a photonic crystal is included in at least one of the mirror layers of the VCSEL. In other words, the photonic crystal can either replace the DBR layers or can be formed in addition to the DBR layers. In the latter case, the number of DBR layers can be reduced. The photonic crystal has high reflectivity such that photons are reflected by the photonic crystal back through the active region, which results in stimulated emission of photons at the corresponding wavelength of the incident photon.

The optical properties of the photonic crystal include sensitive to both the wavelength and the incident angle of the photons. Including a photonic crystal in the structure of the VCSEL enables a single mode to be generated because other wavelengths of light are not reflected and do not have appreciable gain. The wavelength-dependent reflectivity of the photonic crystal enables the VCSEL to generate a single output mode. The power of the VCSEL can be increased by enlarging the aperture through which light is emitted. Enlarging the aperture does not increase the number of modes generated by the VCSEL because the photonic crystal only has high reflectivity for a particular mode.

Additional features and advantages of the invention will be set forth in the description which follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

In order to describe the manner in which the above-recited and other advantages and features of the invention can be obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

Semiconductor lasers, such as vertical cavity surface emitting lasers (VCSELs), often serve as light sources in optical networks. At a basic level, semiconductor lasers are essentially pn-junctions that convert electrical energy into light energy. Typically, a gain medium or active region is formed at the pn-junction between the p-type material and the n-type material. Often, the active region includes a gain medium such as quantum wells. The active region may also include quantum wires or dots. As light passes through the active region or gain medium, the light is amplified by stimulated emission. At certain frequencies or wavelengths, the semiconductor lasers lase and generate output light.

In vertical cavity surface emitting lasers, mirrors are usually formed both above and below the active region. The mirrors reflect light back and forth the through the active region. Within the VCSEL cavity that is effectively bounded by the mirrors or by this mirror system, the light resonates vertically or perpendicularly to the pn-junctions and some light emerges from a surface of the VCSEL. Because the light is resonating vertically, the cavity length of a VCSEL is often very short with respect to the direction of light travel and the length of the cavity thus has an effect on the ability of a proton to produce additional photons through stimulated emission, particularly at low carrier densities. The mirrors increase the likelihood of a photon stimulating the emission of an additional photon. As previously indicated, the light emitted by VCSELs typically has multiple transverse modes or wavelengths.

Figure 1:
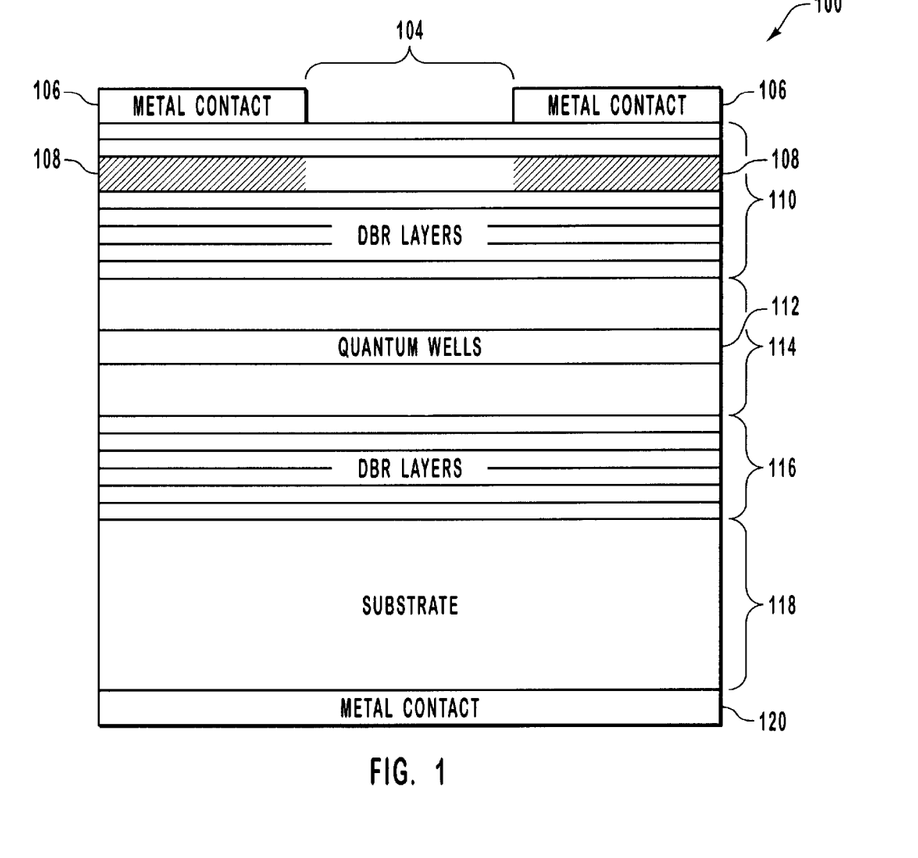
FIG. 1 illustrates an exemplary vertical cavity surface emitting laser that does not include a photonic crystal.

FIG. 1 illustrates an example of a vertical cavity surface emitting laser 100 before the photonic crystal is added or formed. The core of the VCSEL 100 is an active region 114 that includes quantum wells 112. The composition of the quantum wells is often related to the wavelengths that are generated by the VCSEL 100 and are typically formed from some combination of InGaAs or InGaAsP, although the present invention is not limited to these materials. For example, InGaP, AlGaAs, GaAs, InGaAs, and InGaAsP are often used in quantum wells that emit wavelengths of 650, 780, 850, 980, and 1300 nanometers, respectively. The composition of the quantum well has an impact on the band gap, which is related to the wavelengths or modes generated by the VCSEL 100.

The present invention incorporates Distributed Bragg Reflector (DBR) layers as part of the mirror layers in addition to the photonic crystal, which is described below. In the example of FIG. 1, the active region 114 is bounded by the upper DBR layers 110 and the lower DBR layers 116. One of the DBR layers includes n-type semiconductor materials and the other DBR layer includes p-type semiconductor materials. DBR layers are formed by forming or growing alternating layers of materials whose refractive index varies. Each individual DBR layer typically has a thickness of approximately $\lambda/4$. These alternating layers are often formed or grown from semiconductor materials or dielectric materials.

Light is reflected at the junction of the DBR layers, but in order to achieve the high reflectivity required by VCSELs, many layers must be formed or grown as previously discussed. The DBR layers 110 and 116 thus form mirror layers that reflect light through the active region 114. The aperture of the VCSEL 100 through which light is emitted is typically formed by oxidation of some of the DBR layers or ion implantation to form an aperture 104 through which light can escape. Finally, the VCSEL 100 also includes a substrate 118 and includes metal contacts 120 and 106.

Figure 2:
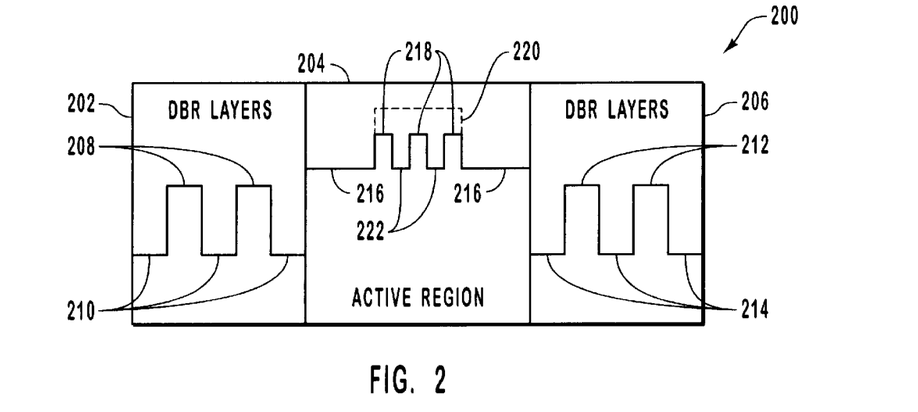
FIG. 2 illustrates the refractive indexes of the DBR layers and of the active region for the vertical cavity surface emitting laser shown in FIG. 1.

FIG. 2 is a block diagram that illustrates the refractive indices of the VCSEL of FIG. 1. Because the DBR layers are arranged in layer pairs, the DBR layers 202 have refractive indices that alternate between the indices 208 and 210. The DBR layers 206 are also arranged in pairs and have refractive indices that alternate between the indices 212 and 214. The refractive index 216 of the active region is usually higher than the refractive indices of the DBR layers 202 and 206. The quantum wells 220 within the active region 204 typical have refractive indices 218 that are higher than the indices 216 of the active region 204. Note that the quantum wells are usually separated by barrier layers whose refractive indices 222 are substantially the same as the indices 216.

Including a photonic crystal in the VCSEL provides several advantages. As described below, the reflectivity of a photonic crystal is sensitive to wavelength and this enables a single mode to be emitted. In addition, the high reflectivity of the photonic crystal reduces the number of DBR layers that need to be formed. In one embodiment, the upper and/or lower DBR layers are replaced by a photonic crystal. By reducing or eliminating the DBR layers, the fabrication process is simplified.

Figure 3:
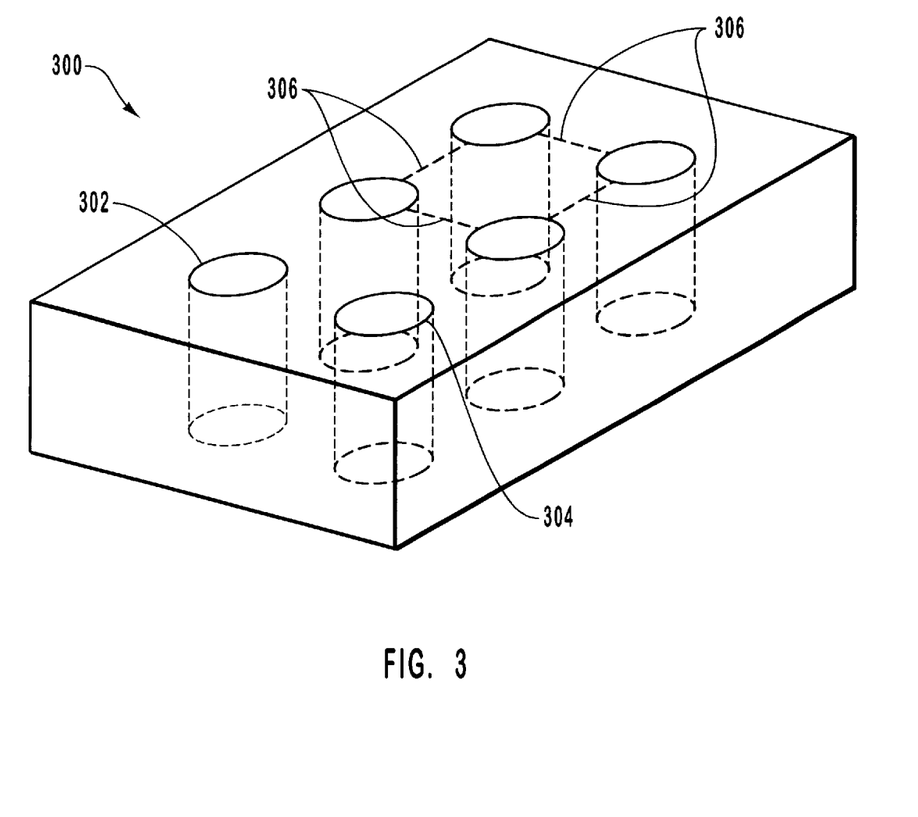
FIG. 3 is a perspective view of an exemplary photonic crystal.

Forming a cavity structure in an appropriate material, such as semiconductor or dielectric materials, results in a photonic crystal or layer. FIG. 3 illustrates an exemplary photonic crystal or layer. In the photonic crystal 300, a plurality of cavities or holes that are periodic in nature are formed or structured in the photonic crystal 300. Cavities 302 and 304 are examples of the cavities that are thus formed in the photonic crystal 300. Each cavity has a depth that can vary according to need. Thus, the cavities may have a depth that extends into other layers of the VCSEL, including the DBR layers and/or the active region. Alternatively, the depth of the cavities are limited to the photonic crystal 300. Thus, each cavity typically passes through the photonic crystal 300 and may extend into other layers of the VCSEL. This causes the photonic crystal 300 to have a perforated quality in this example. It is possible for the cavity structure to be formed such that the photonic crystal 300 is not perforated by cavities. The cavities are formed or placed in the photonic crystal 300 using an appropriate cavity structure that can vary according to design or to the desired wavelength. The distance between cavities in the structure is often on the order of optical wavelengths, although the present invention is not limited to these wavelengths.

Because the photonic crystal can replace the DBR layers in some embodiments, a VCSEL can be fabricated that more easily generates wavelengths on the order of 1.3 to 1.55 microns. It is understood that the present invention is not limited to optical wavelengths. It is further understood that the cavity structure is not limited to optical wavelengths, but that optical wavelengths are used herein as an example of cavity structures in a photonic crystal.

The cavities that are formed in a photonic crystal are usually periodic in nature or repeating. The dashed line 306 illustrates a square cavity structure. Other cavity structures include, but are not limited to, a rhombic cavity structure, a triangular cavity structure, a hexagonal or honeycomb cavity structure, other geometric cavity structures, and the like or any combination thereof. Similarly, each cavity can be formed in different shapes or geometries. Exemplary cross sectional shapes include, but are not limited to, circular cross sections, square cross sections, triangular cross sections, hexagonal or honeycomb cross sections, or other geometric cross sections. The cavities 302 and 304 of this example are circular in nature. As previously stated, the cavities may not pass completely through the photonic crystal, but may form a dimpled surface on the photonic crystal. Alternatively, the cavities may perforate the active region or the other mirror layer of the VCSEL.

Figure 4:
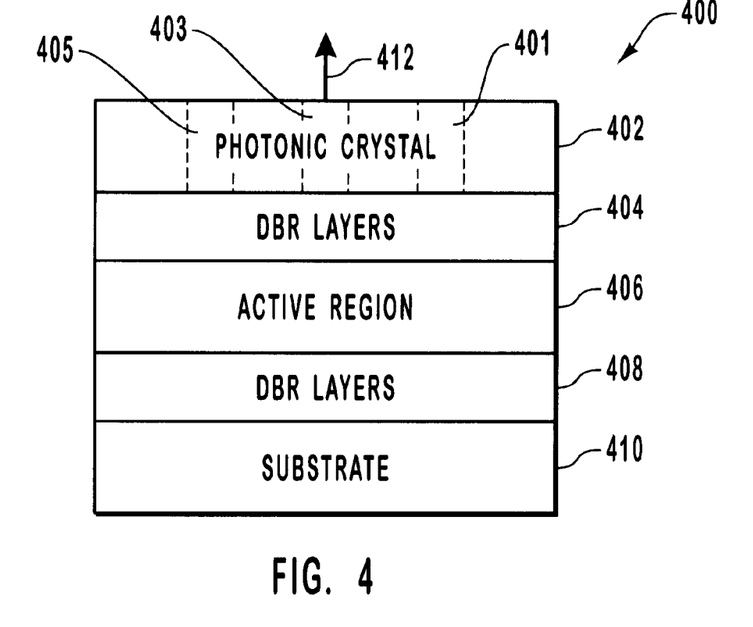
FIG. 4 illustrates a vertical cavity surface emitting laser with a photonic crystal.

FIG. 4 is a block diagram that illustrates the structure of a VCSEL in accordance with the present invention. The structure of the VCSEL 400 includes a substrate 410 that is usually connected with a metal contact. In some cases, the light exits the VCSEL through the substrate 410, which is often transparent to the laser light. Alternatively, the substrate 410 may absorb the light. Usually, one side of the VCSEL is blocked to laser light such that light is only emitted from one side of the VCSEL.

Next, the DBR layers 408 are formed or grown on the substrate 410. An active region 406 is then formed or grown on the mirror or DBR layers 408. The active region 406 usually includes a gain medium such as quantum wells or other gain mediums known in the art. The DBR layers 404 are formed or grown on the active region 406.

A photonic crystal 402 is then grown or formed on the DBR layers 404. The photonic crystal 402 also acts as a mirror and has high reflectivity for certain wavelengths. The reflectivity of the photonic crystal 402 permits the VCSEL 400 to be formed in a variety of different ways. In one example, the number of DBR layers 404 can be reduced because of the reflectivity of the photonic crystal 402. The photonic crystal 402 illustrates the cavities 401, 403, and 405 that have been formed in the photonic crystal 402. These cavities, as previously discussed, are arranged in a periodic cavity structure. Also, the cavities 401, 403, and 405 can extend into the DBR layers 404, the active region 406, and/or the DBR layers 408.

Figure 5:
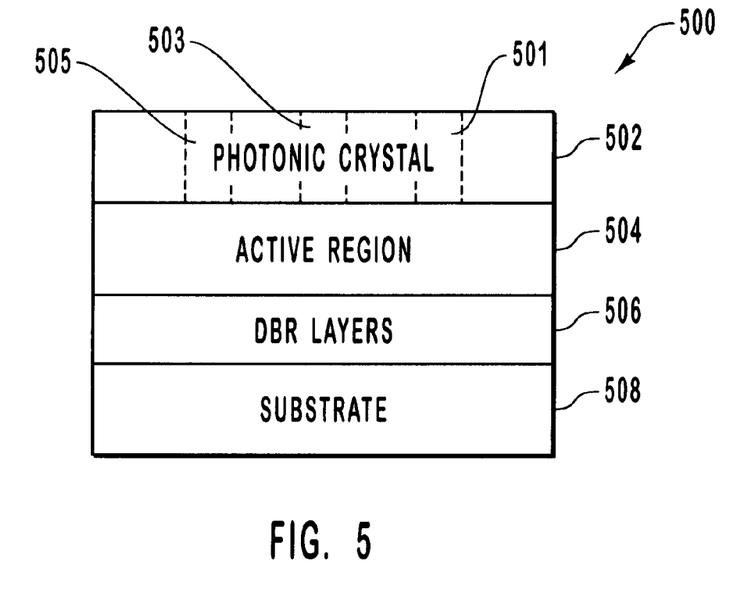
FIG. 5 illustrates another example of a vertical cavity surface emitting laser where the DBR layers are replaced with a photonic crystal.

In another example shown in FIG. 5, the photonic crystal 502 without or instead of the DBR layers. The photonic crystal 502 also illustrates the cavities 501, 503, and 505 that form a cavity structure in the photonic crystal 502. In another example of the present invention, the VCSEL will only have photonic crystals on both sides of the active region 406 and will not have DBR layers. Other embodiments include combinations of a photonic crystal and DBR layers for one or both mirror layers.

The VCSEL structure illustrated in FIG. 4 is an external cavity VCSEL where the external cavity is formed by the photonic crystal 402. The advantage of having an external cavity is that the VCSEL will only lase at those wavelengths that are resonant wavelengths of both the gain cavity and the external cavity. The VCSEL structure of FIG. 5 does not have an external cavity, but is still capable of lasing at a single mode or wavelength.

Figure 6A:
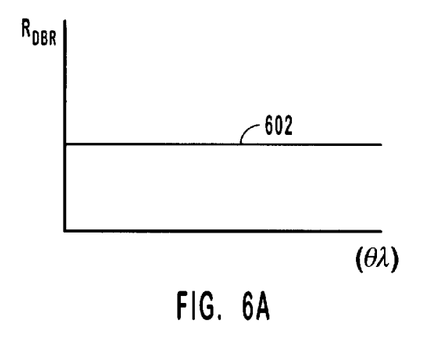
FIG. 6A plots the reflectivity of the DBR layers as a function of wavelength and incident angle.
Figure 6B:
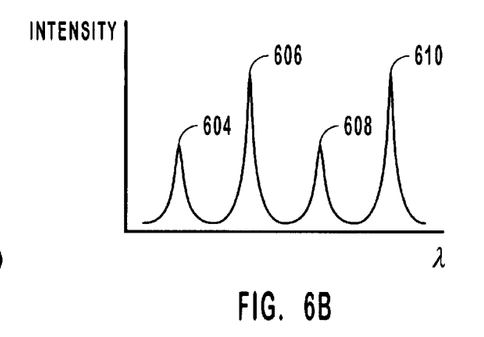
FIG. 6B plots the intensity of the laser light versus the wavelength of the generated laser light for vertical cavity surface emitting lasers that use only DBR layers.

FIG. 6A plots the reflectivity of the DBR layers as a function of incident angle and wavelength. As illustrated, the curve 602 is relatively flat over a range of wavelengths. This is expected as the output of current VCSELs has multiple transverse modes. The intensity of these modes is plotted in FIG. 6B. In FIG. 6B, more than one mode or wavelength (shown as wavelengths 604, 606, 608, and 610, typically separated by wavelengths on the order of a nanometer) is emitted by the VCSEL that does not include a photonic crystal.

Figure 7A:
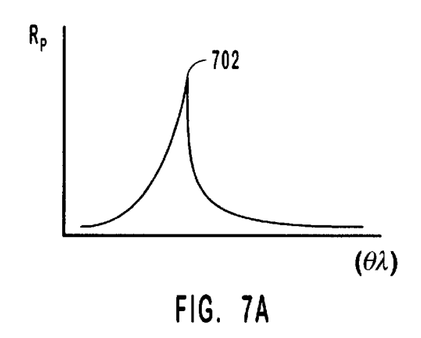
FIG. 7A plots the reflectivity of the photonic crystal as a function of wavelength and incident angle.
Figure 7B:
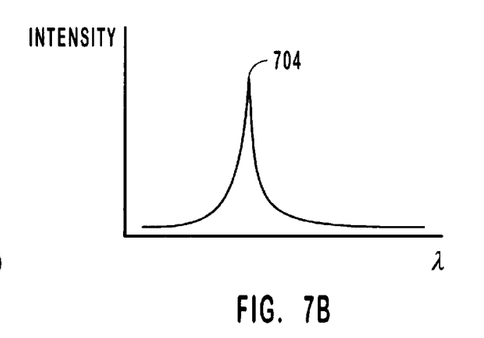
FIG. 7B plots the intensity of the laser light versus the wavelength of the generated laser light for vertical cavity surface emitting lasers that include a photonic crystal.

FIG. 7A, in contrast, plots the reflectivity of a photonic crystal as a function of incident angle and wavelength. The curve 702 of FIG. 7A demonstrates that the reflectivity of the photonic crystal is selective and wavelength dependent. FIG. 7B illustrates that the intensity of the VCSEL output primarily occurs at a single wavelength 704. Other wavelengths or modes do not typically have appreciable gain because those modes are not sufficiently reflected by the photonic crystal. A photonic crystal enables a VCSEL to generate output in a single mode or at a single wavelength. A single mode VCSEL can be fabricated using photonic crystals exclusively or by combining the photonic crystal with DBR layers.

Figure 8:
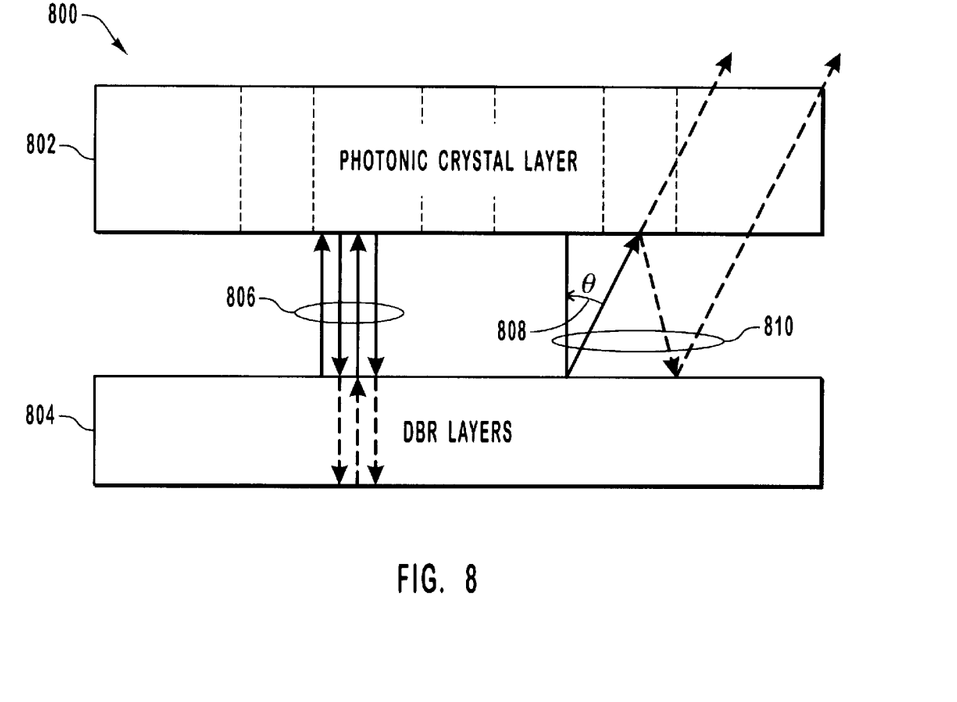
FIG. 8 illustrates the reflectivity of a photonic crystal.

FIG. 8 further illustrates the reflectivity of a photonic crystal. FIG. 8 illustrates the external cavity that is created by the photonic crystal 802 being formed on the DBR layers 804. The light 806 is being reflected by the photonic crystal 802 and/or by the DBR layers 804. The reflectivity of the photonic crystal 802 is dependent on both wavelength and angle. For example, the light 810 is not reflected or is only partially reflected by the photonic crystal 802 because of the incident angle 808 or because of the wavelength. Selecting an appropriate photonic crystal 802 can result in a VCSEL that resonates at a single wavelength or mode.

Changing attributes or characteristics of the photonic crystal can change the mode or output of the VCSEL. The attributes or characteristics of the photonic crystal that can be changed or altered include, but are not limited to, the arrangement or structure of the cavities, the thickness of the photonic crystal, the refractive index of the photonic crystal, the composition of the photonic crystal, the shape/radius of the cavities, the depth of the cavities, and the like or any combination thereof. These attributes can be altered such that the wavelength emitted by the VCSEL is different.

Figure 9:
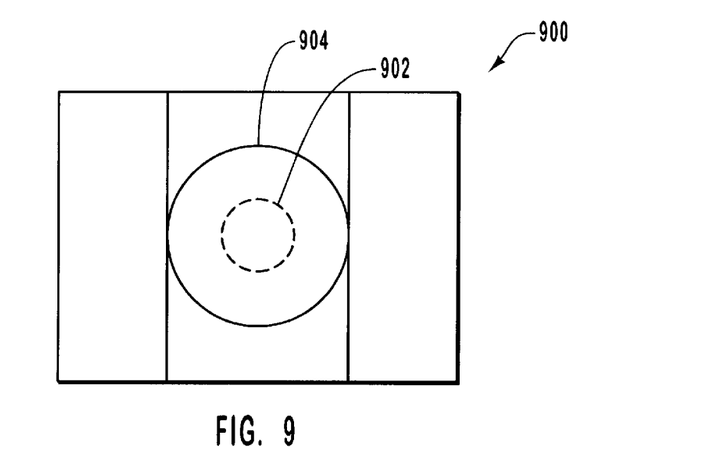
FIG. 9 is a top view of a vertical cavity surface emitting laser with an enlarged aperture to generate more power.

FIG. 9 illustrates a top view of a VCSEL 900. The structure of the VCSEL 900 enables the VCSEL 900 to generate a single mode. The power of the VCSEL 900 is increased by enlarging the aperture through which light is emitted. The aperture 902 illustrates a typical aperture that is on the order of 10 microns. The aperture 904 has a diameter on the order of 100 microns and enables more power to be generated by the VCSEL 900. Forming a photonic crystal on a VCSEL with an enlarged aperture enables the VCSEL to lase at a single wavelength with increased power.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An external cavity vertical cavity surface emitting laser (VCSEL) that emits a single mode, the external cavity VCSEL comprising:
    a gain cavity forming an active region and being bounded by lower Distributed Bragg Reflector layers and upper Distributed Bragg Reflector layers, wherein the lower Distributed Bragg Reflector layers are formed on a substrate; and
    an external cavity formed by a photonic crystal that is positioned on top of the upper Distributed Bragg Reflector layers, wherein the photonic crystal includes a periodic cavity structure and has high reflectivity for a single mode,
    the gain cavity together with the external cavity causing the VCSEL to lase at a single mode or wavelength.

2. An external cavity VCSEL as defined in claim 1, wherein the active region includes one or more quantum wells.

3. An external cavity VCSEL as defined in claim 1, wherein the lower Distributed Bragg Reflector layers have more individual layers than the upper Distributed Bragg Reflector layers.

4. An external cavity VCSEL as defined in claim 1, wherein each cavity in the periodic cavity structure has a depth.

5. An external cavity VCSEL as defined in claim 4, wherein the depth of each cavity in the periodic cavity structure extends into the active region.

6. An external cavity VCSEL as defined in claim 4, wherein the depth of each cavity in the periodic cavity structure does not extend into the active region.

7. An external cavity VCSEL as defined in claim 4, wherein each cavity in the periodic cavity structure has a cross sectional shape, wherein the cross sectional shape is one of:
    a circular cross sectional shape;
    a square cross sectional shape;
    a triangular cross sectional shape;
    a hexagonal cross sectional shape; and
    a geometric cross sectional shape.

8. An external cavity VCSEL as defined in claim 1, wherein the periodic cavity structure is one of:
    a square cavity structure;
    a triangular cavity structure;
    a rhombic cavity structure;
    a hexagonal cavity structure; and
    a geometric cavity structure.

9. An external cavity VCSEL as defined in claim 1, further comprising an enlarged aperture such that more power is produced in the particular mode.

10. An external cavity VCSEL as defined in claim 1, wherein the external cavity does not have high reflectivity for other modes such that the other modes do not experience appreciable gain.

11. A vertical cavity surface emitting laser comprising a mirror layer for reflecting a single mode such that the vertical cavity surface emitting laser emits the single mode with increased power, the mirror layer comprising:
    a plurality of Distributed Bragg reflector layers bounding at least one side an active region of the vertical cavity surface emitting laser, wherein the plurality of Distributed Bragg reflector layers bound a gain cavity that includes one or more quantum wells; and
    a photonic crystal formed on top of the plurality of Distributed Bragg reflector layers such that the photonic crystal forms an external cavity, wherein a plurality of cavities are formed in the photonic crystal to create a cavity structure in the photonic crystal.

12. A mirror layer as defined in claim 11, wherein the cavity structure in the photonic crystal is periodic and includes at least one period.

13. A mirror layer as defined in claim 12, wherein the cavity structure in the photonic crystal is one of:
    a triangular cavity structure;
    a square cavity structure;
    a rhombic cavity structure;
    a honeycomb cavity structure; and
    a geometric cavity structure.

14. A mirror layer as defined in claim 11, wherein each cavity formed in the photonic crystal has a depth that extends through the photonic crystal.

15. A mirror layer as defined in claim 11, wherein each cavity formed in the photonic crystal extends into the plurality of Distributed Bragg Reflector layers.

16. A vertical cavity surface emitting laser that emits a single mode, the vertical cavity surface emitting laser comprising:
    a lower mirror layer formed on a substrate, wherein the lower mirror layer includes Distributed Bragg Reflector layers;
    an active region formed on the lower mirror layer, wherein the active region includes a gain medium that provides gain to photons that are reflected through the active region;
    an upper mirror layer formed on the active region; and
    a photonic crystal adjacent to or part of at least one of the mirror layers, wherein the single mode is reflected by the photonic crystal such that the single mode has appreciable gain.

17. A vertical cavity surface emitting laser as defined in claim 16, the upper mirror layer further comprising one or more Distributed Bragg Reflector layers, wherein the lower mirror layer includes more Distributed Bragg Reflector layers than the upper mirror layer.

18. A vertical cavity surface emitting laser as defined in claim 16, wherein the photonic crystal has a cavity structure formed therein.

19. A vertical cavity surface emitting laser as defined in claim 18, wherein the cavity structure formed in the photonic crystal is periodic.

20. A vertical cavity surface emitting laser as defined in claim 19, wherein each cavity in the cavity structure formed in the photonic crystal has a depth that extends through the photonic crystal and into the active region.

21. A vertical cavity surface emitting laser as defined in claim 20, wherein each cavity in the cavity structure formed in the photonic crystal has a cross sectional shape, wherein each cross sectional shape is one of:

a circular cross sectional shape;

a square cross sectional shape;

a triangular cross sectional shape;

a hexagonal cross sectional shape; and a geometric cross sectional shape.

22. A vertical cavity surface emitting laser as defined in claim 18, wherein each cavity in the photonic crystal formed in the photonic crystal is filled with air.

23. A vertical cavity surface emitting laser as defined in claim 18, wherein the photonic crystal forms an external cavity.

24. A vertical cavity surface emitting laser as defined in claim 16, further comprising an enlarged aperture such that more power is produced in the particular mode.

* * * * *